United States Patent
Luo et al.

(10) Patent No.: US 10,996,779 B2
(45) Date of Patent: May 4, 2021

(54) DISPLAY SUBSTRATE, DISPLAY PANEL, TOUCH DISPLAY DEVICE AND METHOD FOR FABRICATING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Hongqiang Luo, Beijing (CN); Jianjun Wu, Beijing (CN); Kwanggyun Jang, Beijing (CN); Hairui Zhao, Beijing (CN)

(73) Assignees: Chengdu Boe Optoelectronics Technology Co., Ltd., Sichuan (CN); Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/610,840

(22) PCT Filed: Feb. 28, 2019

(86) PCT No.: PCT/CN2019/076431
§ 371 (c)(1),
(2) Date: Nov. 4, 2019

(87) PCT Pub. No.: WO2019/223386
PCT Pub. Date: Nov. 28, 2019

(65) Prior Publication Data
US 2020/0371627 A1    Nov. 26, 2020

(30) Foreign Application Priority Data
May 25, 2018 (CN) .......................... 201810516544.1

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G02F 1/133528* (2013.01);
(Continued)

(58) Field of Classification Search
CPC ......... G06F 3/0412; G06F 2203/04102; G06F 2203/04103; G02F 1/136286;
(Continued)

(56) References Cited

U.S. PATENT DOCUMENTS 10,649,566 B2 *  5/2020  Yeh ........................ G06F 3/0412
2012/0299888 A1 * 11/2012  Kim .................... G02F 1/13458
                                                                345/205
(Continued)

FOREIGN PATENT DOCUMENTS

CN          204884440 U      12/2015
CN          2014884440 U     12/2015
(Continued)

OTHER PUBLICATIONS

Office Action of CN Application No. 201810516544.1, dated Nov. 29, 2019, 10 pages.
(Continued)

*Primary Examiner* — Muhammad N Edun
(74) *Attorney, Agent, or Firm* — Muncy, Geissler, Olds & Lowe, P.C.

(57) ABSTRACT

The present disclosure provides a display substrate, a display panel, a touch display device and a method for fabricating the same. The display substrate includes a display area, a non-display area, signal lines in the display area, first ones of first binding pins in the non-display area for binding (Continued)

to a flexible circuit board, second ones of first binding pins in the non-display area for binding to the flexible circuit board; and second binding pins in the non-display area for binding to a touch panel. The second ones of first binding pins are coupled with the signal lines; and the second binding pins are coupled with the first ones of first binding pins in a one-to-one manner.

13 Claims, 6 Drawing Sheets

(51) Int. Cl.
    *G02F 1/1335*     (2006.01)
    *G02F 1/1362*     (2006.01)
    *H01L 27/32*     (2006.01)
    *H01L 51/52*     (2006.01)
    *H01L 51/56*     (2006.01)
    *H05K 1/02*     (2006.01)
    *H05K 1/18*     (2006.01)

(52) U.S. Cl.
    CPC ...... *G02F 1/136286* (2013.01); *H01L 27/323* (2013.01); *H01L 27/3276* (2013.01); *H01L 51/529* (2013.01); *H01L 51/5293* (2013.01); *H01L 51/56* (2013.01); *H05K 1/028* (2013.01); *H05K 1/189* (2013.01); *G06F 2203/04102* (2013.01); *G06F 2203/04103* (2013.01); *H05K 2201/10136* (2013.01)

(58) Field of Classification Search
    CPC .......... G02F 1/13338; G02F 1/133528; H05K 1/189; H05K 2201/10136; H05K 1/028; H01L 51/5293; H01L 51/529; H01L 27/3276; H01L 27/323; H01L 51/56
    See application file for complete search history.

(56) References Cited

U.S. PATENT DOCUMENTS

| | | | |
|---|---|---|---|
| 2015/0103274 A1* | 4/2015 | Huang | ................. G06F 3/0412 349/12 |
| 2015/0199038 A1* | 7/2015 | Li | ......................... G06F 1/1643 345/173 |
| 2015/0277604 A1 | 10/2015 | Choi et al. | |
| 2017/0215288 A1 | 7/2017 | Shi | |
| 2018/0239476 A1* | 8/2018 | Yoshida | ............ G02F 1/136286 |
| 2018/0329530 A1 | 11/2018 | Yu et al. | |
| 2019/0004645 A1 | 1/2019 | Wang et al. | |

FOREIGN PATENT DOCUMENTS

| | | |
|---|---|---|
| CN | 106125992 A | 11/2016 |
| CN | 106229332 A | 12/2016 |
| CN | 106547407 A | 3/2017 |
| CN | 106653777 A | 5/2017 |
| CN | 106919287 A | 7/2017 |
| CN | 107479283 A | 12/2017 |
| CN | 108762562 A | 11/2018 |

OTHER PUBLICATIONS

International Search Report of PCT/CN2019/076431, dated Apr. 29, 2019, 10 pages.

* cited by examiner

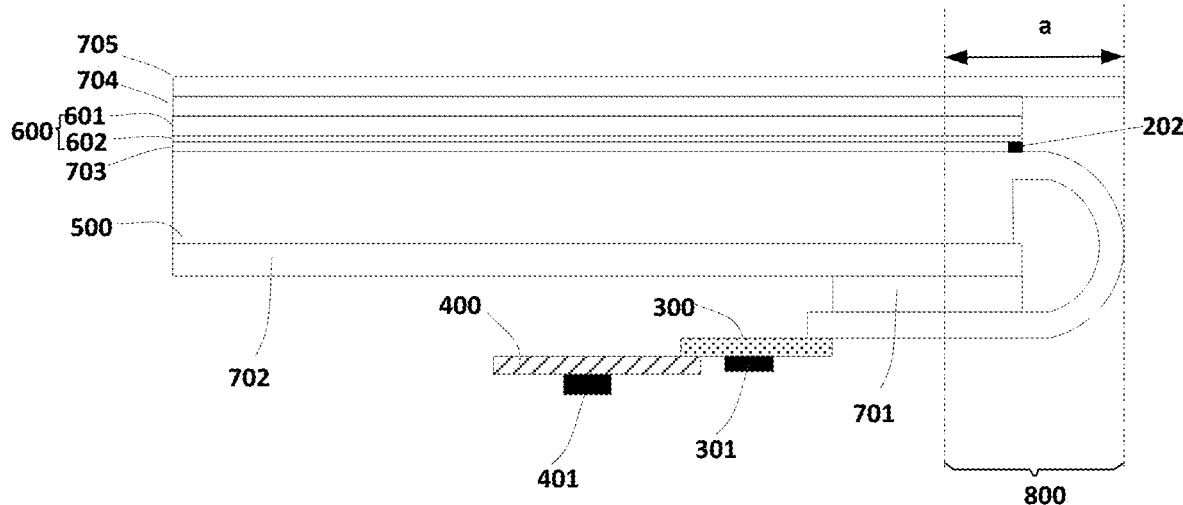

FIG. 7

```
providing a display panel; where the display panel includes a       S11
display substrate that includes a display area and a non-display
   area located at the periphery of the display area, there is a
plurality of first binding pins and a plurality of second binding
pins in the non-display area, one part of the first binding pins is
connected with signal lines in the display area, and the second
     binding pins are connected with another part of the first
             binding pins in a one-to-one manner ↓
                                                                    S12
binding the display panel to a flexible circuit board through the
  first binding pins; where the flexible circuit board includes a
                     driver IC and a touch IC

↓ attaching the display panel to the touch panel, and binding the    S13
 display panel to the touch panel through the second binding
                                pins
```

FIG. 8

```
┌─────────────────────────────────────────────────────────────────────────┐
│ providing a display panel; where the display panel includes a display substrate that
│ includes a display area and a non-display area located at the periphery of the display     ⟋ S21
│ area, there is a plurality of first binding pins and a plurality of second binding pins in
│ the non-display area, one part of the first binding pins is connected with signal lines
│ in the display area, and the second binding pins are connected with another part of
│ the first binding pins in a one-to-one manner, the display panel is a flexible display
│ panel, the non-display area includes a bendable area and an unbendable area, the
│ first binding pins are disposed in the bendable area, and the second binding pins are
│                          disposed in the unbendable area
└─────────────────────────────────────────────────────────────────────────┘
                                      │
                                      ▼
┌─────────────────────────────────────────────────────────────────────────┐
│ binding the display panel to a flexible circuit board through the first binding pins;
│ where the flexible circuit board includes a chip on film and a main flexible printed       ⟋ S22
│ circuit, the chip on film is provided with a driver IC, the main flexible printed circuit
│     is provided with a touch IC, and the chip on film is bound to the display panel
│                            through the first binding pins
└─────────────────────────────────────────────────────────────────────────┘
                                      │
                                      ▼
┌─────────────────────────────────────────────────────────────────────────┐
│ attaching the display panel to the touch panel, and binding the display panel to the      ⟋ S23
│                    touch panel through the second binding pins
└─────────────────────────────────────────────────────────────────────────┘
                                      │
                                      ▼
┌─────────────────────────────────────────────────────────────────────────┐
│ bending the bendable area towards one side of the display panel distal to the touch
│ panel and then fixing the flexible circuit board to the one side of the display panel     ⟋ S24
│                             distal to the touch panel
└─────────────────────────────────────────────────────────────────────────┘
```

FIG. 9

DISPLAY SUBSTRATE, DISPLAY PANEL, TOUCH DISPLAY DEVICE AND METHOD FOR FABRICATING THE SAME

CROSS-REFERENCE TO RELATED APPLICATION

This application is the U.S. national phase of PCT Application No. PCT/CN2019/076431 filed on Feb. 28, 2019, which claims priority to Chinese patent application No. 201810516544.1, filed with the Chinese State Intellectual Property Office on May 25, 2018, which is incorporated herein by reference in its entirety.

TECHNICAL FIELD

The present disclosure relates to the field of display technologies, and in particular to a display substrate, a display panel, a touch display device and a method for fabricating the same.

BACKGROUND

An add-on touch display device is to attach an add-on touch screen to an outside of a display panel. In the related art, when performing the bonding process for the add-on touch display device, the display panel is first bound to a chip on film (COF) with a driver IC and a main flexible printed circuit (MFPC), a touch panel is bound to a touch flexible printed circuit (TFPC) with a touch IC, and then the touch panel is bound to the display panel, finally, the main flexible printed circuit is bound to touch flexible printed circuit. It can be seen that in the binding process, multiple bindings are required and thus the binding process is complicated.

SUMMARY

One embodiment of the present disclosure provides a display substrate that includes: a display area; a non-display area at a periphery of the display area; signal lines in the display area; a plurality of first ones of first binding pins in the non-display area for binding to a flexible circuit board; a plurality of second ones of first binding pins in the non-display area for binding to the flexible circuit board; and a plurality of second binding pins in the non-display area for binding to a touch panel. The second ones of first binding pins are coupled with the signal lines; and the second binding pins are coupled with the first ones of first binding pins in a one-to-one manner.

Optionally, the display substrate is a flexible display substrate; the non-display area includes a bendable area and an unbendable area connected with the bendable area; the unbendable area is close to the display area relative to the bendable area; and the first ones of first binding pins and the second ones of first binding pins are in the bendable area.

Optionally, the second binding pins are in the unbendable area.

One embodiment of the present disclosure further provides a display panel that includes the above display substrate.

One embodiment of the present disclosure further provides a touch display device that includes the above display panel and a touch panel attached to the display panel; wherein touch electrodes on the touch panel are coupled with the second binding pins of the display substrate of the display panel.

Optionally, the touch display device further includes a flexible circuit board. The flexible circuit board is provided with a driver IC and a touch IC; the driver IC is coupled with the signal lines on the display panel through the second ones of first binding pins of the display substrate of the display panel; and the touch IC is coupled with the touch electrodes on the touch panel through the first ones of first binding pins of the display substrate of the display panel and the second binding pins.

Optionally, the flexible circuit board includes a chip on film and a main flexible printed circuit; the driver IC is disposed at the chip on film; and the touch IC is disposed at the main flexible printed circuit.

Optionally, the touch display device further includes at least one of: a heat dissipation film disposed at one side of the display panel distal to the touch panel; a polarizer disposed at one side of the touch panel distal to the display panel; and a packing cover plate disposed at the one side of the touch panel distal to the display panel.

Optionally, the display panel is a flexible display panel; the non-display area includes a bendable area and an unbendable area connected with the bendable area; the unbendable area is close to the display area of the display panel relative to the bendable area; the touch display device further includes an adhesive; and the adhesive fixes the bendable area to one side of the display panel distal to the touch panel.

One embodiment of the present disclosure further provides a method for fabricating a touch display device that includes: providing a display panel; where the display panel includes a display substrate that includes a display area and a non-display area located at a periphery of the display area, there are a plurality of first ones of first binding pins, a plurality of second ones of first binding pins and a plurality of second binding pins in the non-display area, the second ones of first binding pins are coupled with the signal lines in the display area, and the second binding pins are coupled with the first ones of first binding pins in a one-to-one manner; binding the display panel to the flexible circuit board through the first ones of first binding pins and the second ones of first binding pins; wherein the flexible circuit board includes a driver IC and a touch IC; and attaching the display panel to the touch panel, and binding the display panel to the touch panel through the second binding pins.

Optionally, the display panel is a flexible display panel, and the non-display area includes a bendable area; after binding the display panel to the flexible circuit board through the first ones of first binding pins and the second ones of first binding pins, the method further includes: bending the bendable area towards one side of the display panel distal to the touch panel and then fixing the flexible circuit board to the one side of the display panel distal to the touch panel.

Optionally, before bending the bendable area towards one side of the display panel distal to the touch panel and then fixing the flexible circuit board to the one side of the display panel distal to the touch panel, the method further includes: attaching a polarizer to the touch panel; attaching a packing cover plate to the polarizer; attaching a heat dissipation film to one side of the display panel distal to the touch panel; and attaching an adhesive to the heat dissipation film.

Optionally, bending the bendable area towards one side of the display panel distal to the touch panel and then fixing the flexible circuit board to the one side of the display panel distal to the touch panel, includes: using an adhesive to fix the bendable area to the one side of the display panel distal to the touch panel.

Optionally, the first ones of first binding pins and the second ones of first binding pins are in the bendable area.

Optionally, the non-display area further includes an unbendable area connected with the bendable area; the unbendable area is close to the display area relative to the bendable area; and the second binding pins are in the unbendable area.

BRIEF DESCRIPTION OF THE DRAWINGS

In order to explain the technical solutions in embodiments of the present disclosure more clearly, accompanying drawings needed in the description of the embodiments are briefly illustrated hereinafter. Apparently, the accompanying drawings described hereinafter show only some embodiments of the present disclosure, and those skilled in the art may further conceive other drawings according to the drawings without creative work.

FIG. 7 is a schematic side view of a touch display device according to an embodiment of the present disclosure;

FIG. 8 is a schematic flow chart of a method for fabricating a touch display device according to an embodiment of the present disclosure;

FIG. 9 is a schematic flow chart of a method for fabricating a touch display device according to another embodiment of the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments are merely a part of, rather than all of, the embodiments of the present disclosure, and based on these embodiments, a person skilled in the art may obtain the other embodiments, which also fall within the scope of the present disclosure.

Figure 1:
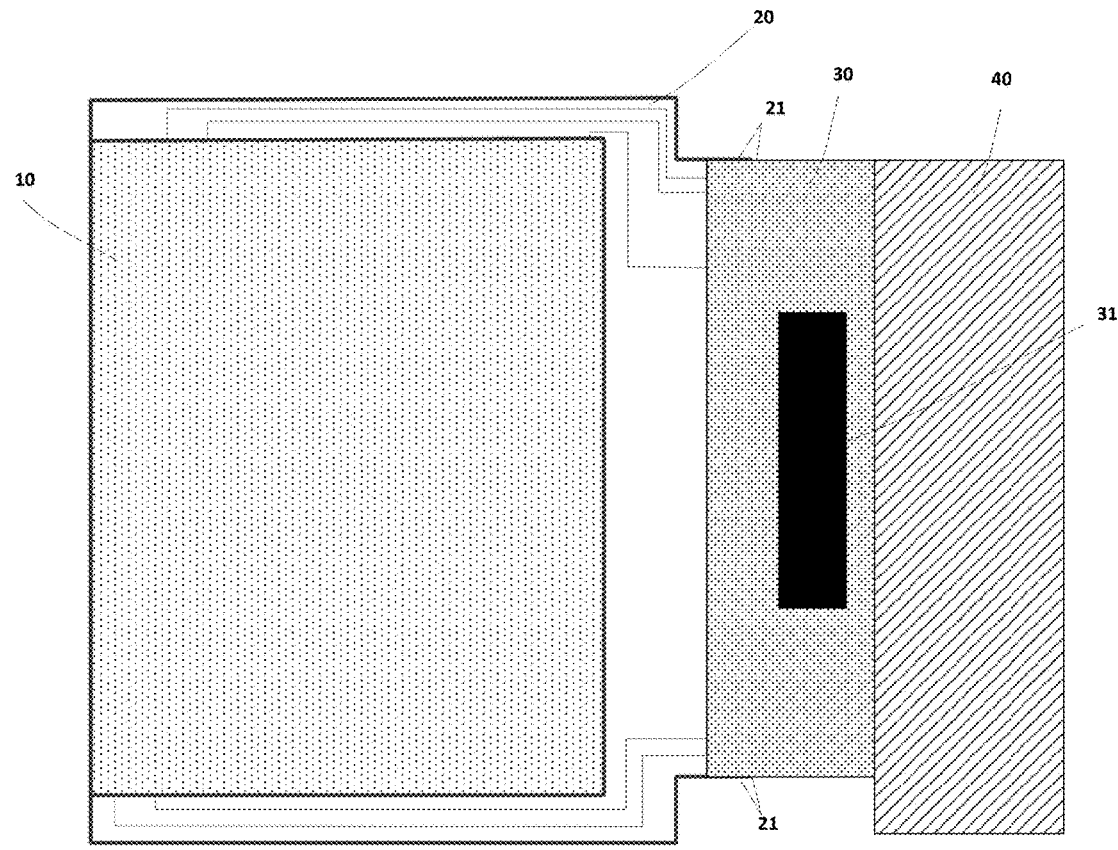
FIG. 1 is a schematic top view of a display panel bound to a chip on film as well as a main flexible printed circuit in the related art.
Figure 2:
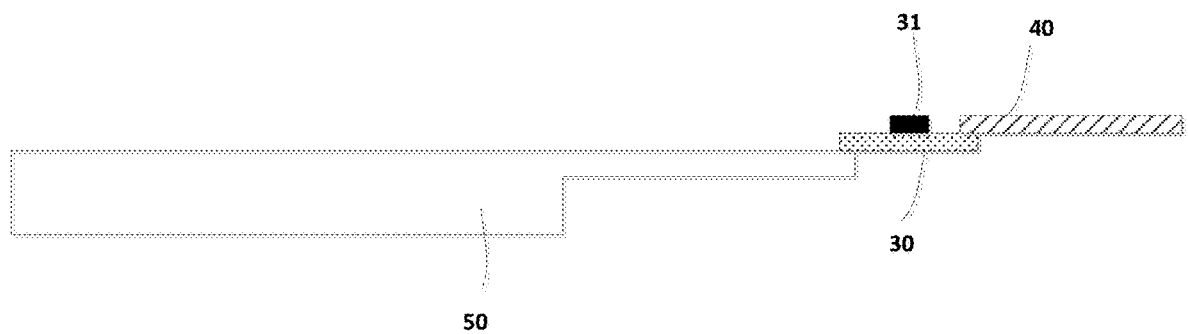
FIG. 2 is a schematic side view of a display panel bound to a chip on film as well as a main flexible printed circuit in the related art.
Figure 3:
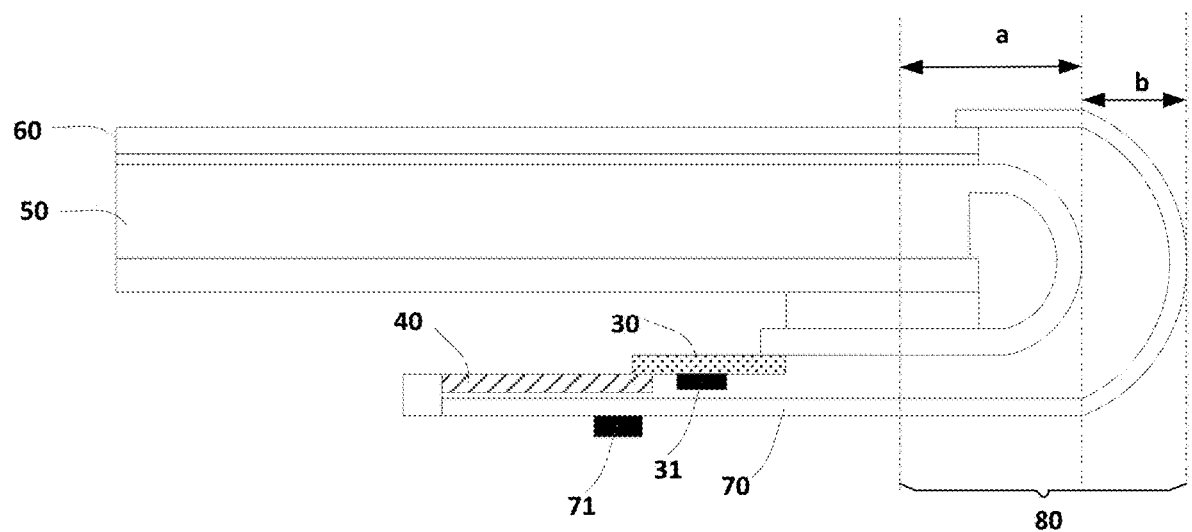
FIG. 3 is a schematic side view of a touch display device bound to a chip on film as well as a main flexible printed circuit in the related art, where the touch display device includes a display panel and a touch panel.

Referring to FIG. 1, FIG. 2 and FIG. 3, FIG. 1 is a schematic top view of a display panel bound to a chip on film as well as a main flexible printed circuit in the related art; FIG. 2 is a schematic side view of a display panel bound to a chip on film as well as a main flexible printed circuit in the related art; and FIG. 3 is a schematic side view of a touch display device bound to a chip on film as well as a main flexible printed circuit in the related art, where the touch display device includes a display panel and a touch panel.

The display panel 50 includes a display area 10 and a non-display area 20 located at the periphery of the display area 10. There is a plurality of binding pins 21 in the non-display area 20.

During a binding process, a chip on film (COF) 30 with a driver IC 31 and a main flexible printed circuit (MFPC) 40 are first bound to the display panel 50, as shown in FIG. 1 and FIG. 2; and then a touch flexible printed circuit (TFPC) 70 with a touch IC 71 is bound to a touch panel 60. And then, the touch panel 60 is attached to the display panel 50. Finally, the main flexible printed circuit 40 is bound to the touch flexible printed circuit 70, as shown in FIG. 3. It can be seen that in the above binding process, multiple bindings are required and thus the binding process is complicated.

Figure 4:
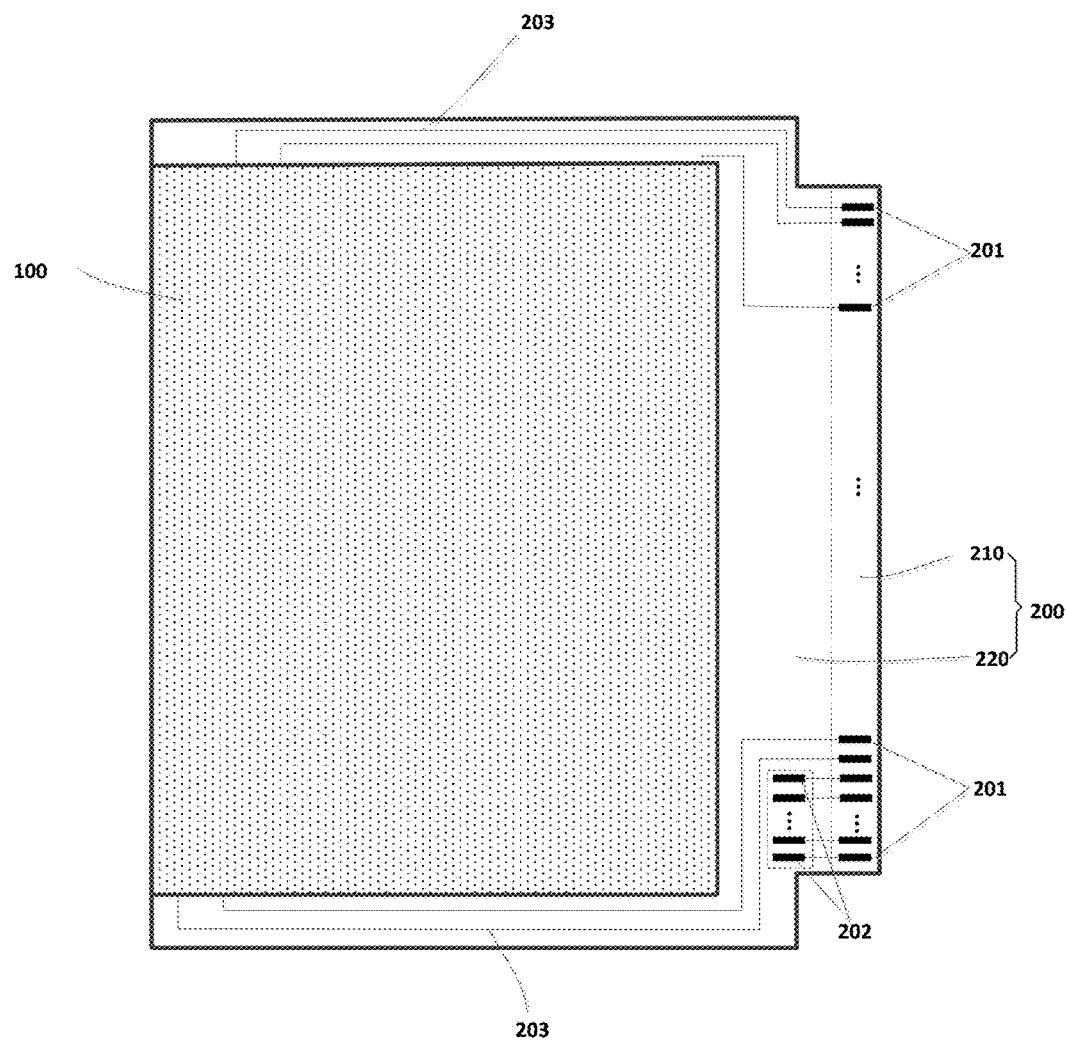
FIG. 4 is a schematic top view of a display substrate according to an embodiment of the present disclosure.

In order to solve the problem that the binding process for touch display devices in the related art is complicated, referring to FIG. 4, one embodiment of the present disclosure provides a display substrate that includes a display area 100 and a non-display area 200 located at the periphery of the display area 100. There is a plurality of first binding pins 201 and a plurality of second binding pins 202 in the non-display area 200. The first binding pin 201 is for binding to a flexible circuit board. One part of first binding pins 201 is connected with signal lines (not shown) in the display area 100, thereby enabling the signal lines to be coupled with a driver IC on the flexible circuit board through the first binding pins 201. The driver IC is used to provide driving signals for displaying to the display substrate, and the driving signals may include gate scanning signals, data signals, etc. In one embodiment shown in FIG. 4, one part of first binding pins 201 is connected with signal lines in the display area 100 through signal line leads 203 in the non-display area 200. The signal lines may include gate lines, data lines, etc. The second binding pin 202 is for binding to a touch panel. The second binding pins 202 are connected with another part of the first binding pins 201 in a one-to-one manner, thereby enabling touch electrodes on the touch panel to be coupled with a touch IC on the flexible circuit board through the second binding pins 202 and the first binding pins 201. The touch IC is configured to provide touch signals for the touch panel. In actual application, the touch electrodes on the touch panel may be coupled with the second binding pins 202 through touch electrode leads, etc., thereby enabling the touch electrodes on the touch panel to be coupled with the touch IC on the flexible circuit board through the second binding pins 202 and the first binding pins 201.

In one embodiment of the present disclosure, the second binding pins 202 for binding to the touch panel are added to the display substrate, the second binding pins 202 are coupled with the first binding pins 201, and the first binding pins 201 are configured for binding to the flexible circuit board, and the flexible circuit board is provided with both of the driver IC and the touch IC. When the bonding process is performed for the display panel with the display substrate, the touch panel may be directly bound to the display panel with the display substrate through the second binding pins 202, and then may be coupled with the touch IC on the flexible circuit board through the first binding pins 201 on the display substrate. Then, there is no need to separately bind the touch panel to the touch flexible circuit board. Meanwhile, the binding process is simplified by reducing the step of binding the touch flexible circuit board with the touch IC to a main flexible circuit board in the binding process in the related art.

In one embodiment of the present disclosure, the display substrate may be a bendable and flexible display substrate, or may be an unbendable rigid display substrate. When the display substrate is a flexible display substrate, the base substrate of the display substrate may be made of flexible material such as resin. When the display substrate is a rigid display substrate, the base substrate of the display substrate may be made of rigid material such as glass.

Referring to FIG. 4, in one embodiment of the present disclosure, when the display substrate is a flexible display substrate, the non-display area 200 may include a bendable area 210 and an unbendable area 220. After completion of the bonding process of the display panel having the display substrate, one portion of the display panel may be bent towards a backside (non-display side) of the display panel at the bendable area 210, thereby enabling the flexible circuit board bound to the display panel to be bent to the backside of the display panel and then achieving a narrow border. The bendable area 210 is usually disposed at a lower border of the display panel.

In one embodiment of the present disclosure, optionally, the first binding pins 201 are disposed in the bendable area 210, thereby reducing a width of the unbendable area 220 and then helping to achieve a narrow border.

In one embodiment of the present disclosure, optionally, the second binding pins 202 are disposed in the unbendable area 220. If the second binding pins 202 are disposed in the bendable area 210, it will increase the thickness of the bendable area 210 and affect bending since the unbendable area 220 are for bonding to the touch panel. Thus, by arranging the second binding pins 202 in the unbendable area 220, it can avoid problems that the thickness of the bendable area 210, is too large, which affects bending.

In one embodiment of the present disclosure, the display substrate may be a liquid crystal display substrate, an organic light emitting diode (OLED) display substrate, or other type of display substrate.

In one embodiment of the present disclosure, the display substrate is usually an array substrate.

One embodiment of the present disclosure further provides a display panel that includes the display substrate of any one of the above embodiments.

In one embodiment of the present disclosure, the display substrate may be a liquid crystal display substrate, an organic light emitting diode (OLED) display substrate, or other type of display substrate.

In one embodiment of the present disclosure, when the display substrate is a liquid crystal display substrate, in addition to the above display substrate (which is usually an array substrate), the liquid crystal display substrate may further include an opposite substrate (which is usually a color film substrate), and a liquid crystal layer sandwiched between the display substrate and the opposite substrate.

In one embodiment of the present disclosure, when the display substrate is an organic light emitting diode (OLED) display substrate, in addition to the above display substrate (which is usually an array substrate), the liquid crystal display substrate may further include a packaging substrate, etc.

One embodiment of the present disclosure further provides a touch display device that includes the display panel of the above embodiment and a touch panel attached to the display panel.

It should be noted that, in one embodiment of the present disclosure, when attaching the touch panel to the display panel, one side of the touch panel with the touch electrodes faces the display panel, thereby enabling the touch electrodes to be coupled with the second binding pins 202 on the display panel.

The touch display device according to one embodiment of the present disclosure may further include a flexible circuit board. The flexible circuit board is provided with a driver IC and a touch IC. The flexible circuit board is bound to the display panel through the first binding pins on the display panel. The driver IC is coupled with signal lines on the display panel through one part of the first binding pins. The touch IC is coupled with touch electrodes on the touch panel through another part of the first binding pins and the second binding pins.

In an optional embodiment of the present disclosure, the flexible circuit board includes a chip on film (COF) and a main flexible printed circuit (MFPC). The driver IC is disposed at the chip on film. The touch IC is disposed at the main flexible printed circuit.

In some optional embodiments of the present disclosure, at least one part of the flexible circuit board is bent to one side (i.e., the backside of the display panel) of the display panel distal to the touch panel.

In some embodiments, the display panel may be a flexible display panel. The display panel includes a display area and a non-display area. The non-display area further includes a bendable area. The first binding pins are disposed in the bendable area. After the display panel is bound to the flexible circuit board through the first binding pins, one portion of the display panel may be bent towards a backside (non-display side) of the display panel at the bendable area, thereby enabling the flexible circuit board bound to the display panel to be bent to the backside of the display panel.

In another some embodiments, after the display panel is bound to the flexible circuit board, the flexible circuit board (such as the chip on film) may be directly bent so that at least one part of the flexible circuit board is bent to the backside of the display panel. In this case, the display panel may be a flexible display panel or a rigid display panel.

In some optional embodiments of the present disclosure, the touch display device includes a display panel, a touch panel and a flexible circuit board. The display panel includes a display substrate. The display substrate includes a display area and a non-display area located at the periphery of the display area. There is a plurality of first binding pins and a plurality of second binding pins in the non-display area. One part of first binding pins is connected with signal lines in the display area. The second binding pins are connected with another part of the first binding pins in a one-to-one manner. The display panel is a flexible display panel. The non-display area includes a bendable area and an unbendable area. The first binding pins are disposed in the bendable area. The second binding pins are disposed in the unbendable area. The touch panel is attached to the display panel. The touch panel is bound to the display panel through the second binding pins.

The flexible circuit board includes a chip on film and a main flexible printed circuit. The chip on film is provided with a driver IC. The main flexible printed circuit is provided with a touch IC. The chip on film is bound to the display panel through the first binding pins. The flexible circuit board is bent to one side of the display panel distal to the touch panel.

In one embodiment of the present disclosure, the display substrate may be a liquid crystal display substrate, an organic light emitting diode (OLED) display substrate, or other type of display substrate.

Figure 5:
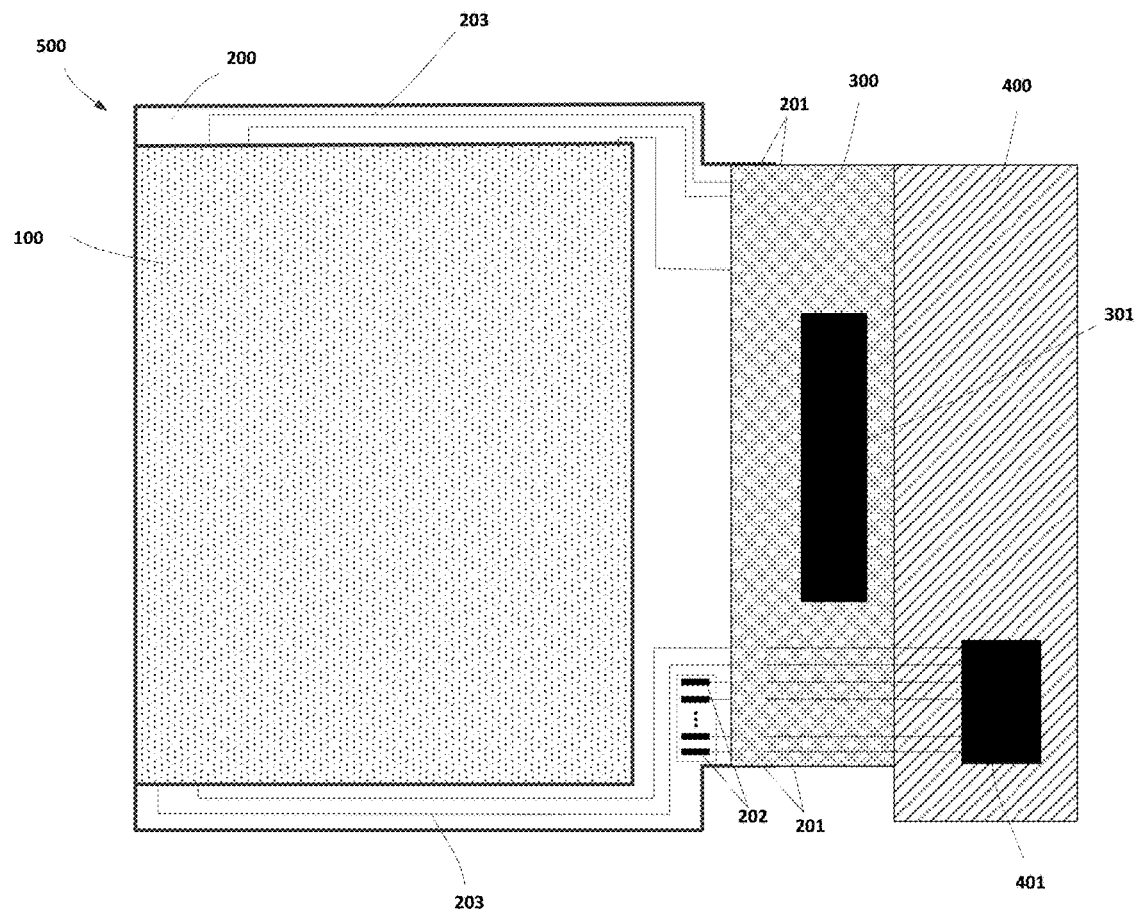
FIG. 5 is a schematic top view of a touch display device according to an embodiment of the present disclosure.
Figure 6:
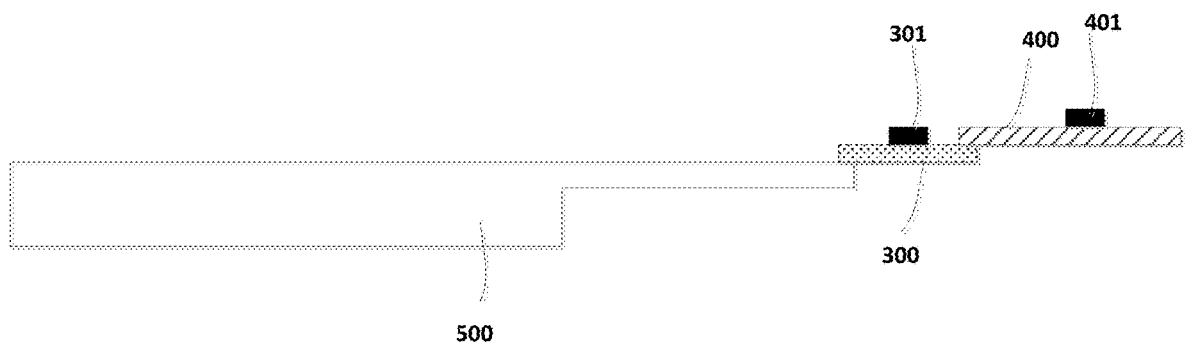
FIG. 6 is a schematic side view showing a display panel bound to a flexible circuit board in a touch display device according to an embodiment of the present disclosure.
Figure 10:
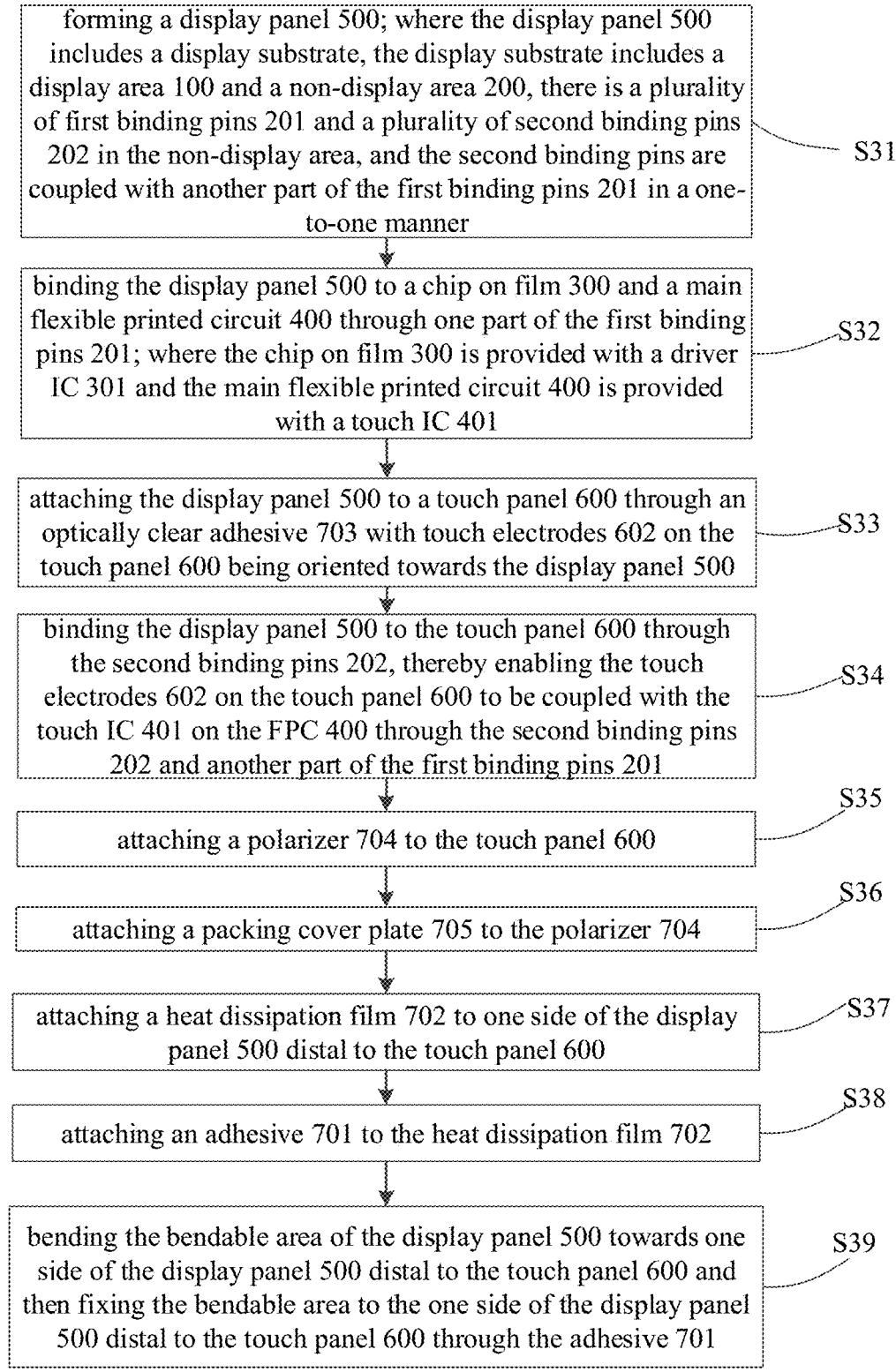
FIG. 10 is a schematic flow chart of a method for fabricating a touch display device according to yet another embodiment of the present disclosure.

Referring to FIG. 5, FIG. 6 and FIG. 7, FIG. 5 is a schematic top view of a touch display device according to an embodiment of the present disclosure; FIG. 6 is a schematic side view showing a display panel bound to a flexible circuit board in a touch display device according to an embodiment of the present disclosure; FIG. 7 is a schematic side view of a touch display device according to an embodiment of the present disclosure. The touch display device includes a display panel 500, a touch panel 600 and a flexible circuit board bound to the display panel 500.

The display panel 500 includes a display substrate. The display substrate includes a display area and a non-display area. There is a plurality of first binding pins 201 in the non-display area. The first binding pins 201 are for binding to the flexible circuit board. Meanwhile, there is a plurality of second binding pins 202 in the non-display area. The second binding pins are for binding to the touch panel 600.

The touch panel 600 is attached to a display side of the display panel 500 through an optically clear adhesive (OCA) 703. The touch panel 600 includes a touch substrate 601 and touch electrodes 602 disposed on the touch substrate 601. The touch electrodes 602 are oriented towards the display panel 500 so as to be coupled with the second binding pins 202.

The flexible circuit board includes a chip on film 300 and a main flexible printed circuit 400. The chip on film 300 is provided with a driver IC 301. The main flexible printed circuit 400 is provided with a touch IC 401. The driver IC 301 is coupled with signal lines in a display area of the display panel 500 through one part of the first binding pins 201. The touch IC 401 is coupled with the touch electrodes 602 on the touch panel 600 through another part of the first binding pins 201 and the second binding pins 202.

In one embodiment of the present disclosure, the second binding pins 202 for binding to the touch panel 600 are added to the display panel 500, the second binding pins 202 are coupled with the first binding pins 201, and the first binding pins 201 are configured for binding to the flexible circuit board, and the flexible circuit board is provided with both of the driver IC and the touch IC. When the bonding process is performed for the touch display device with the display panel 500, the touch panel 600 may be directly bound to the display panel 500 through the second binding pins 202, and then may be coupled with the touch IC 401 on the flexible circuit board through the first binding pins 201. Then, there is no need to separately bind the touch panel 600 to the touch flexible circuit board. Meanwhile, the binding process is simplified by reducing the step of binding the touch flexible circuit board with the touch IC to the main flexible circuit board in the binding process in the related art.

In one embodiment of the present disclosure, the display panel 500 is a flexible display panel. Referring to FIG. 7, in order to achieve a narrow border, the display panel 500 of one embodiment includes a bendable area. The bendable area is bendable towards a backside (non-display side) of the display panel 500, thereby enabling the flexible circuit board (including the chip on film 300 and the main flexible printed circuit 400) to be located at the backside of the display panel 500. The bendable area is disposed at a lower border of the touch display device. As can be seen from FIG. 7, the lower border 800 of the touch display device has a width of a, which is a width from a panel bending point to a display area (panel AA) of the display panel 500.

Meanwhile, referring to FIG. 3, the display panel 50 of the touch display device in the related art may also include a bendable area which may be bendable towards a backside (non-display side) of the display panel 50, thereby enabling the main flexible printed circuit 40 to be located at the backside of the display panel 50. Meanwhile, the touch flexible printed circuit 70 may also be bent towards a backside (non-display side) of the display panel 50, thereby enabling the touch flexible printed circuit 70 to be located at the backside of the display panel 50. The bendable area is disposed at a lower border of the touch display device. As can be seen from FIG. 3, the lower border 80 of the touch display device has a width of a+b, where "a" represents a width from a panel bending point to a display area (panel AA) of the display panel, "b" represents a width from the panel bending point to a bending point of the touch flexible printed circuit 70 and "b" is usually greater than or equal to 0.3 mm. As can be seen from FIG. 3, two layers (including the main flexible printed circuit 40 and the touch flexible printed circuit 70) are bent at the bendable area, and thus the width of the bendable area is large, which is not conducive to realization of ultra-narrow bezel.

Comparing with the touch display device in the related art shown in FIG. 3, it can be seen that, in one embodiment of the present disclosure, since the touch panel 600 can be directly bound to the display panel 500 and then coupled with the touch IC 401 integrated on the main flexible printed circuit 400 through the display panel 500, only one layer is bent at the bendable area, and thus the width of the bendable area is reduced, which is conducive to realization of ultra-narrow bezel.

In one embodiment of the present disclosure, the touch display device may further include at least one of the following:

an adhesive 701 configured to fix the bent portion of the display panel 500 to the backside of the display panel 500; where the adhesive 701 may be made of foam;

a heat dissipation film 702 such as SCF disposed at one side of the display panel 500 distal to the touch panel and used for heat dissipation for the display panel 500;

a polarizer 704 disposed at one side of the touch panel 600 distal to the display panel 500;

a packing cover plate 705 disposed at one side of the touch panel 600 distal to the display panel 500, where the packing cover plate 705 is usually a glass cover plate.

FIG. 8 is a schematic flow chart of a method for fabricating a touch display device according to an embodiment of the present disclosure. Referring to FIG. 8, the method includes:

a step S11 of providing a display panel; where the display panel includes a display substrate that includes a display area and a non-display area located at the periphery of the display area, there is a plurality of first binding pins and a plurality of second binding pins in the non-display area, one part of the first binding pins is connected with signal lines in the display area, and the second binding pins are connected with another part of the first binding pins in a one-to-one manner;

a step S12 of binding the display panel to a flexible circuit board through the first binding pins; where the flexible circuit board includes a driver IC and a touch IC; and a step S13 of attaching the display panel to the touch panel, and binding the display panel to the touch panel through the second binding pins.

In some optional embodiments of the present disclosure, the display panel is a flexible display panel, and the non-display area includes a bendable area. After binding the display panel to the flexible circuit board through the first binding pins, the method further includes: bending one portion of the display panel towards one side of the display panel distal to the touch panel and then fixing the flexible circuit board to the one side of the display panel distal to the touch panel.

In some optional embodiments of the present disclosure, referring to FIG. 9, a method for fabricating a touch display device according to an embodiment of the present disclosure includes:

a step S21 of providing a display panel; where the display panel includes a display substrate that includes a display area and a non-display area located at the periphery of the display area, there is a plurality of first binding pins and a plurality of second binding pins in the non-display area, one part of the first binding pins is connected with signal lines in the display area, and the second binding pins are connected with another part of the first binding pins in a one-to-one manner, the display panel is a flexible display panel, the non-display area includes a bendable area and an unbendable area, the first binding pins are disposed in the bendable area, and the second binding pins are disposed in the unbendable area;

a step S22 of binding the display panel to a flexible circuit board through the first binding pins; where the flexible circuit board includes a chip on film and a main flexible printed circuit, the chip on film is provided with a driver IC, the main flexible printed circuit is provided with a touch IC, and the chip on film is bound to the display panel through the first binding pins;

a step S23 of attaching the display panel to the touch panel, and binding the display panel to the touch panel through the second binding pins;

a step S24 of bending one portion of the display panel towards one side of the display panel distal to the touch panel and then fixing the flexible circuit board to the one side of the display panel distal to the touch panel.

Referring to FIG. 5, FIG. 6, FIG. 7 and FIG. 10, FIG. 10 is a schematic flow chart of a method for fabricating a touch display device according to yet another embodiment of the present disclosure, the method may include the following steps:

a step S31 of forming a display panel 500; where the display panel 500 includes a display substrate, the display substrate includes a display area 100 and a non-display area 200, there is a plurality of first binding pins 201 and a plurality of second binding pins 202 in the non-display area, and the second binding pins are coupled with another part of the first binding pins 201 (which may also be referred as first ones of the first binding pins) in a one-to-one manner;

a step S32 of binding the display panel 500 to a chip on film 300 and a main flexible printed circuit 400 through one part of the first binding pins 201 (which may also be referred as second ones of the first binding pins); where the chip on film 300 is provided with a driver IC 301 and the main flexible printed circuit 400 is provided with a touch IC 401;

a step S33 of attaching the display panel 500 to a touch panel 600 through an optically clear adhesive (OCA) 703 with touch electrodes 602 on the touch panel 600 being oriented towards the display panel 500;

a step S34 of binding the display panel 500 to the touch panel 600 through the second binding pins 202, thereby enabling the touch electrodes 602 on the touch panel 600 to be coupled with the touch IC 401 on the FPC 400 through the second binding pins 202 and another part of the first binding pins 201;

a step S35 of attaching a polarizer 704 to the touch panel 600;

a step S36 of attaching a packing cover plate 705 to the polarizer 704;

a step S37 of attaching a heat dissipation film 702 to one side of the display panel 500 distal to the touch panel 600;

a step S38 of attaching an adhesive 701 to the heat dissipation film 702;

a step S39 of bending one portion of the display panel 500 towards one side of the display panel 500 distal to the touch panel 600 at the bendable area and then fixing the one portion of the display panel 500 to the one side of the display panel 500 distal to the touch panel 600 through the adhesive 701.

Unless otherwise defined, any technical or scientific terms used herein shall have the common meaning understood by a person of ordinary skills. Such words as "first" and "second" used in the specification and claims are merely used to differentiate different components rather than to represent any order, number or importance. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

The above are merely the optional embodiments of the present disclosure. It should be noted that, a person skilled in the art may make improvements and modifications without departing from the principle of the present disclosure, and these improvements and modifications shall also fall within the scope of the present disclosure.

What is claimed is:

1. A touch display device comprising:
a display panel;
a touch panel attached to the display panel; and
a flexible circuit board,
wherein the display panel includes a display substrate, the display substrate including:
a display area including signal lines; and
a non-display area at a periphery of the display area,
wherein the non-display area includes a plurality of first binding pins and a plurality of second binding pins; the plurality of first binding pins include a first part of the plurality of first binding pins and a second part of the plurality of first binding pins,
wherein the second part of the plurality of first binding pins are coupled with the signal lines; the first part of the plurality of first binding pins are coupled with the plurality of second binding pins,
wherein touch electrodes on the touch panel are coupled with the plurality of second binding pins of the display substrate of the display panel,
wherein the flexible circuit board is provided with a driver IC and a touch IC; the driver IC is coupled with the second part of the plurality of first binding pins; and the touch IC is coupled with the first part of the plurality of first binding pins, and
wherein the flexible circuit board includes a chip on film and a main flexible printed circuit the driver IC is disposed at the chip on film; and the touch IC is disposed at the main flexible printed circuit.

2. The touch display device of claim 1, wherein the non-display area includes a bendable area and an unbendable area connected with the bendable area; the unbendable area is close to the display area relative to the bendable area; and the first part of the plurality of first binding pins and the second part of the plurality of first binding pins are in the bendable area.

3. The touch display device of claim 2, wherein the plurality of second binding pins are in the unbendable area.

4. The touch display device of claim 1, wherein at least one part of the flexible circuit board is bent to one side of the display panel distal to the touch panel.

5. The touch display device of claim 1, wherein the non-display area includes a bendable area and an unbendable area connected with the bendable area; the unbendable area is close to the display area of the display panel relative to the bendable area;
the touch display device further includes an adhesive; and
the adhesive fixes the bendable area to one side of the display panel distal to the touch panel.

6. The touch display device of claim 1, wherein the plurality of second binding pins are coupled with the first part of the plurality of first binding pins in a one-to-one manner.

7. The touch display device of claim 1, wherein the touch panel is attached to a display side of the display panel through an optically clear adhesive.

8. A touch display device comprising:
a display panel; and
a touch panel attached to the display panel,
wherein the display panel includes a display substrate, the display substrate including:
a display area including signal lines; and
a non-display area at a periphery of the display area,
wherein the non-display area includes a plurality of first binding pins and a plurality of second binding pins; the plurality of first binding pins include a first part of the plurality of first binding pins and a second part of the plurality of first binding pins,
wherein the second part of the plurality of first binding pins are coupled with the signal lines; the first part of the plurality of first binding pins are coupled with the plurality of second binding pins,
wherein touch electrodes on the touch panel are coupled with the plurality of second binding pins of the display substrate of the display panel, and
wherein the touch display device of claim 1, further comprises at least one of:
a heat dissipation film disposed at one side of the display panel distal to the touch panel;
a polarizer disposed at one side of the touch panel distal to the display panel; and
a packing cover plate disposed at the one side of the touch panel distal to the display panel.

9. A method for fabricating a touch display device comprising:
providing a display panel; wherein the display panel includes a display substrate that includes a display area including signal lines and a non-display area located at a periphery of the display area, the non-display area includes a plurality of first binding pins and a plurality of second binding pins, the plurality of first binding pins include a first part of the plurality of first binding pins and a second part of the plurality of first binding pins, the second part of the plurality of first binding pins are coupled with the signal lines and the plurality of second binding pins are coupled with the first part of the plurality of first binding pins;
binding the display panel to the flexible circuit board through the first part of the plurality of first binding pins and the second part of the plurality of first binding pins, with a driver IC of the flexible circuit board being coupled with the second part of the plurality of first binding pins and a touch IC of the flexible circuit board being coupled with the first part of the plurality of first binding pins; and attaching the display panel to the touch panel and binding the display panel to the touch panel through the plurality of second binding pins wherein the non-display area includes a bendable area; after binding the display panel to the flexible circuit board through the first part of the plurality of first binding pins and the second part of the plurality of first binding pins,
attaching a polarizer to the touch panel;
attaching a packing cover plate to the polarizer;
attaching a heat dissipation film to one side of the display panel distal to the touch panel;
attaching an adhesive to the heat dissipation film; and
bending the bendable area towards one side of the display panel distal to the touch panel and then fixing the flexible circuit board to the one side of the display panel distal to the touch panel.

10. The method of claim 9, wherein bending the bendable area towards one side of the display panel distal to the touch panel and then fixing the flexible circuit board to the one side of the display panel distal to the touch panel, includes:
using an adhesive to fix the bendable area to the one side of the display panel distal to the touch panel.

11. The method of claim 9, wherein the first part of the plurality of first binding pins and the second part of the plurality of first binding pins are in the bendabie area.

12. The method of claim 11, wherein the non-display area further includes an unbendable area connected with the bendable area; the unbendable area is close to the display area relative to the bendable area; and the plurality of second binding pins are in the unbendable area.

13. The method of claim 9, wherein the plurality of second binding pins are coupled with the first part of the plurality of first binding pins in a one-to-one manner.

* * * * *